United States Patent [19]

Triboulet et al.

[11] Patent Number: 4,662,980

[45] Date of Patent: May 5, 1987

[54] PROCESS FOR PREPARING CRYSTALS OF HG1-X CDX TE

[75] Inventors: Robert Triboulet, Meudon; Gérard Didier, Meudon la Foret; Alain Durand, Poitiers; Michel Royer, Paris, all of France

[73] Assignee: Societe Anonyme de Telecommunications, Paris, France

[21] Appl. No.: 782,200

[22] Filed: Sep. 30, 1985

Related U.S. Application Data

[63] Continuation of Ser. No. 637,333, Aug. 3, 1984, abandoned, which is a continuation of Ser. No. 355,882, Mar. 8, 1982, abandoned.

[30] Foreign Application Priority Data

Mar. 18, 1981 [FR] France .............................. 81 05387

[51] Int. Cl.$^4$ ............................................. C30B 9/06
[52] U.S. Cl. ................................ 156/604; 156/616 R; 156/DIG. 72
[58] Field of Search ....... 156/600, 604, 620, DIG. 72, 156/DIG. 82, 616 R, 624

[56] References Cited

U.S. PATENT DOCUMENTS

| | | | |
|---|---|---|---|
| 3,241,925 | 3/1966 | Van Cakenberghe | 156/604 |
| 3,429,818 | 2/1969 | Di Benedetto et al. | 156/604 |
| 3,496,118 | 2/1970 | Willardson et al. | 156/604 |
| 3,622,399 | 11/1971 | Johnson | 156/DIG. 72 |
| 3,771,970 | 11/1973 | Hemmat et al. | 156/604 |
| 3,880,677 | 4/1975 | Nishizawa et al. | 156/624 |
| 4,076,572 | 2/1978 | Kimura | 156/624 |
| 4,187,139 | 2/1980 | Brice et al. | 156/600 |
| 4,401,487 | 8/1983 | Lockwood | 156/624 |

OTHER PUBLICATIONS

Goodman; "Crystal Growth Theory & Techniques"; vol. 1, pp. 197-201; 1974.

Fiorito et al.; "A Possible Method for the Growth of Homogeneous Mercury Cadmium Telluride Single Crystals"; J. Electrochem. Soc. (USA); vol. 125; No. 2; pp. 315-317; Feb. 1978.

R. Triboulet, "CdTe and CdTe:Hg Alloys Crystal Growth Using Stoichiometric and Offstoichiometric Zone Passing Techniques" Revue de Physique Appliques, vol. 12, Feb. 1977, pp. 123-128.

Primary Examiner—John Doll
Assistant Examiner—Robert Kunemund
Attorney, Agent, or Firm—Holman & Stern

[57] ABSTRACT

Process for preparing crystals of $Hg_{1-x}Cd_xTe$, in which ingots of HgTe and of CdTe are made to pass through a solvent zone, characterized in that it comprises the step of using as solvent a mixture of tellurium, of HgTe and of CdTe in proportions corresponding to thermodynamic balance.

9 Claims, 3 Drawing Figures

PROCESS FOR PREPARING CRYSTALS OF HG1-X CDX TE

This is a continuation of application Ser. No. 637,333, filed Aug. 3, 1984 which in turn is a continuation of Ser. No. 355,882 filed Mar. 8, 1982 (Now abandoned).

BACKGROUND OF THE INVENTION

The invention relates to a process for preparing crystals of $Hg_{1-x}Cd_xTe$ of high purity according to a so-called THM (Travelling Heater Method) technique, whereby ingots of compounds entering in the composition of the crystal to be obtained are caused to pass through a zone of solvent.

The ternary compound $Hg_{1-x}Cd_xTe$ is a semiconductor of which the forbidden band width varies with the proportion x of cadmium. Depending on the proportion x chosen, photodetectors may be obtained whose spectral sensitivity is located in different domains of the infrared (about 1.5 $\mu$m for $x \simeq 0.7$, about 10 $\mu$m for $x \simeq 0.20$).

The article by R. Triboulet, "CdTe and CdTe:Hg alloys crystal growth using stoichiometric and offstoichiometric zone passing techniques" which appeared in the Revue de Physique Appliquée, Vol. 12, February 1977, page 123, describes the preparation of crystals of $Hg_{1-x}Cd_xTe$, with $x \simeq 0.9$ from an ingot of HgTe and an ingot of CdTe, with the aid of tellurium as solvent. The two source ingots move at a very slow speed with respect to the appropriately heated solvent zone. The part of the source ingots which penetrates in the solvent zone dissolves and a single crystal of $Hg_{1-x}Cd_xTe$ is formed on leaving this zone, the proportion x of cadmium being a function of the ratio between the sections of the source ingots.

On reading the above-mentioned article, it is observed that the composition of the ingot of $Hg_{1-x}Cd_xTe$ obtained is not constant over the whole of its length. In fact, it is observed that the head of the ingot presents a greater proportion of cadmium than the desired value x, and that consequently the desired proportion x is obtained only over part of the ingot, representing about 60 to 70% of its length.

The problem which resulted in the instant invention and which the inventors, MM. TRIBOULET, DIDIER, DURAND and ROYER, (the two first mentioned inventors working with the CNRS Bellevue Solid Stages Physics Laboratory), wanted to solve consequently consists in eliminating this undesirable variation in the composition at the head of the ingot, so that virtually the whole ingot presents the desired composition and therefore the desired spectral sensitivity.

It has been discovered that this variation in the composition was attributable to the fact that the solvent, composed solely of tellurium at the beginning of the process, became initially rich in CdTe and HgTe in a ratio equal to that of the sections of the source ingots, corresponding to a proportion $x_L$ of CdTe, but that the ingot which is then formed on leaving the solvent zone presents a proportion $x_S$ of cadmium, determined by the phase chart, which is greater than $x_L$.

Due to this difference between $x_L$ and $x_S$, the taking of CdTe from the solvent zone is greater than the addition of CdTe and progressively, the solvent zone becomes lean in cadmium and, inversely, becomes rich in mercury. This is accompanied by a concomitant reduction of the difference between $x_L$ and $x_S$ and a state of thermodynamic balance is finally reached in which the ingot formed presents a proportion $x_S$ equal to the desired proportion $x_L$ corresponding to the ratio of the sections of the source ingots, and the solvent zone contains determined amounts of CdTe and HgTe, in addition to the tellurium.

SUMMARY OF THE INVENTION

From this discovery, the invention provides using as solvent, instead of pure tellurium, a solvent composed of tellurium, mercury telluride (HgTe) and cadmium telluride (CdTe) in proportions corresponding to the thermodynamic balance mentioned above.

As the composition of the solvent is, from the beginning, at the value of balance, the ingot formed presents, from the beginning, a proportion $x_S$ of cadmium substantially equal to the desired proportion, so that the ingot obtained may be used over the whole of its length.

The composition of balance, for a given value x, depends only on thermodynamic data corresponding to the temperature of the solvent, which is itself chosen as a function of x.

By way of example, for a proportion of cadmium $x=0.7$, with a temperature of 700° C., the proportions will be as follows:

Te: 68% mol,
CdTe: 2% mol,
HgTe: 30% mol.

BRIEF DESCRIPTION OF THE DRAWING

The invention will be more readily understood on reading the following description with reference to the accompanying drawings, in which.

DETAILED DESCRIPTION OF A PREFERRED EMBODIMENT OF THE INVENTION

Figure 1:
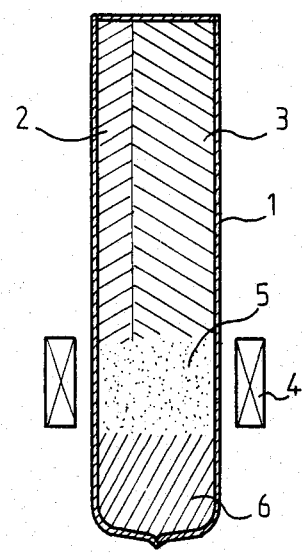
FIG. 1 schematically illustrates the preparation of an ingot of $Hg_{1-x}Cd_xTe$ by the THM technique.

Referring now to the drawings, FIG. 1 shows a hermetically closed enclosure 1 made of refractory material, inside which an ingot 2 of HgTe and an ingot 3 of CdTe of the same length have been placed. The cross-sectional form of these ingots is of little importance, provided that the ratio of their cross sections is equal to the desired cadmium/mercury ratio in the final product. They are, for example, portions of a cylinder.

An annular heating device 4 constituted by a conducting winding surrounds the enclosure 1 and moves along the axis thereof at a speed of the order of 1 to 5 mm per day, the means of displacement being of any type.

Inside the enclosure is a mixture of tellurium, HgTe and CdTe which is liquid at the heating temperature and which acts as solvent for the ingots of HgTe and CdTe. The resulting solvent zone 5 is limited to the portion heated by the device 4 and moves from one end of the ingots to the other due to the displacement of the heating device.

That part of the ingots 2 and 3 which comes into contact with the solvent zone 5 dissolves and recrystallizes on leaving the zone 5 in the form of a single ingot 6 of $Hg_{1-x}Cd_xTe$ of high purity, in which the ratio of the proportions of mercury and of cadmium corresponds to the ratio of the sections of the ingots 2 and 3 of HgTe and of CdTe.

The temperature T in the solvent zone is between about 600° and 700° C., the exact value depending on the desired value x. For x=0.7, a temperature T of 700° C. is preferably applied.

For x=0.7 and T=700° C., a solvent of the following composition is used:
Te: 68% mol,
CdTe: 2% mol,
HgTe: 30% mol.

The composition of the solvent mixture corresponds to the equilibrium composition resulting from the thermodynamic data at temperature T.

Figure 2:
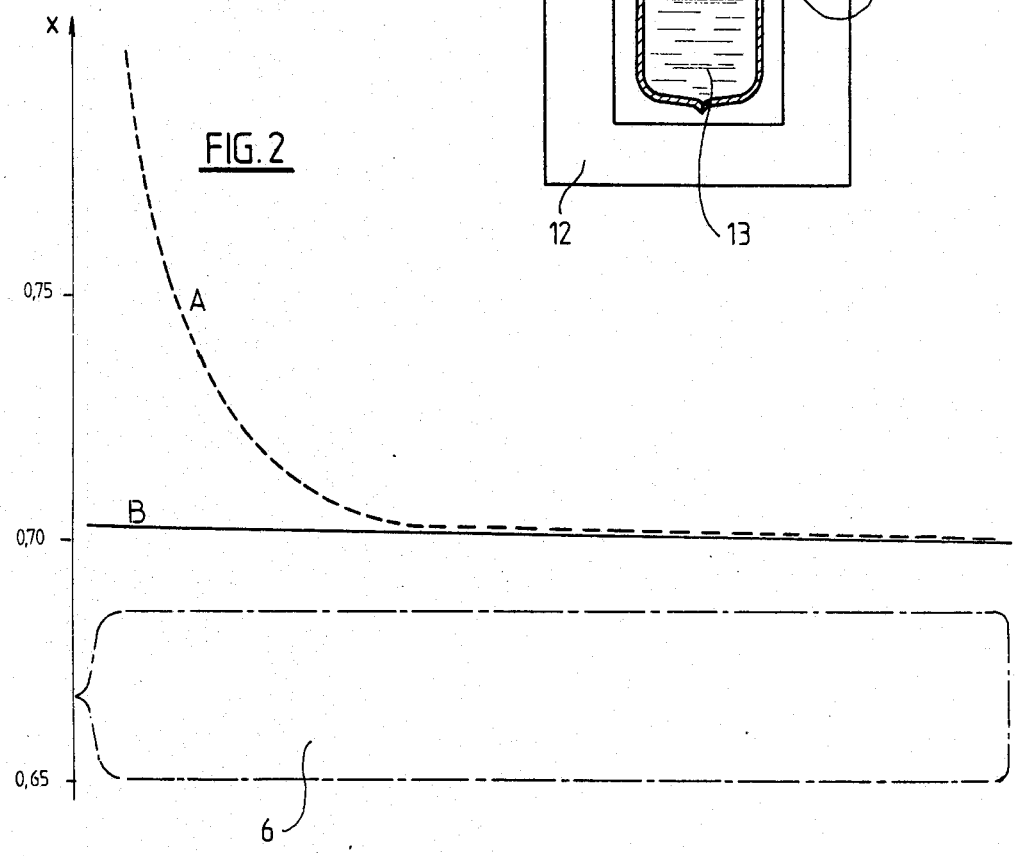
FIG. 2 shows the composition profile of the ingot obtained according to the invention, compared with the result of the conventional process.

FIG. 2 compares the composition profile of the $Hg_{1-x}Cd_xTe$ ingot obtained in the case of x=0.7, when pure tellurium is used as the solvent (curve A in broken lines) with one in which the mixture according to the invention defined hereinabove is used as the solvent (curve B in solid lines).

It is seen that, with the tellurium solvent, the ingot presents at its head (left-hand end of the curves) a proportion of cadmium greater than 0.7, and that the part of the ingot in which this value is substantially increased represents about 70% of the length of the ingot.

On the contrary, with the mixture according to the invention, the composition is homogeneous and corresponds to the value x=0.7 over virtually the whole length of the ingot.

Figure 3:
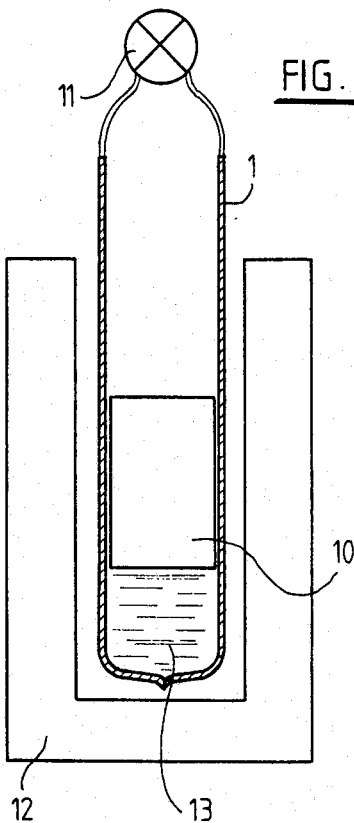
FIG. 3 illustrates the preparation of the solvent zone.

The preparation of the solvent zone is illustrated in FIG. 3 and is effected as follows:

The desired proportions of tellurium, cadmium telluride CdTe and mercury telluride HgTe are firstly placed at the bottom of the enclosure 1. These products are in the solid state and are in the form of pieces.

A quartz piston 10 is placed on these products, with a view to ensuring a perfectly planar surface of the solvent zone.

The enclosure is connected to a source of vacuum via the valve 11, a vacuum is created and a neutral gas such as argon is introduced inside the enclosure, up to a pressure of about 2 to 3 atmospheres, to prevent decomposition of the HgTe during heating.

The products placed at the bottom of the enclosure are then melted by being heated in an oven 12. The piston 10 floats on the molten mixture 13 formed, since its density is lower than that of the molten mixture. After 2 to 3 hours, heating is stopped and the mixture crystallises. Due to the presence of the piston 10, the free surface has remained perfectly plane.

In the absence of the piston 10, the free (upper) surface of the liquid would not be perfectly planar due to the poor wetting character of the molten Te+HgTe+CdTe mixture and, upon dissolution of the source ingots 2 and 3 in the solvent zone, the progression would not be the same over the whole cross-section of the enclosure.

After crystallisation, the enclosure is opened, the piston 10 is withdrawn and the source ingots 2 and 3 are introduced, after which the above-described process may begin.

What is claimed is:

1. A process for preparing a substantially uniform crystalline ingot of $Hg_{1-x}Cd_xTe$ of substantially uniform composition by the Travelling Heater Method (THM), comprising the steps of
   putting together, as source ingots, two portions of cylinder, one of Hg Te, the other of Cd Te with the ratio of their respective sections being equal to the desired Cd/Hg ratio in the final crystalline ingot;
   heating to a temperature a solvent consisting essentially of a mixture of Te, HgTe, and CdTe in proportions corresponding to that of the liquid phase of the ingot to be prepared, at said temperature to melt said mixture and afford a solvent zone;
   moving said solvent zone along two source ingots of HgTe and CdTe, from one end thereof to the other end, so that the portions of the source ingots which progressively come into contact with said solvent zone dissolve therein to form a homogeneous solution; and
   permitting the crystallization of a solid solution from said homogeneous solution, to form a single ingot of substantially uniform composition from one end to the other, containing proportions of HgTe and CdTe corresponding to said temperature.

2. The process of claim 1 wherein the ratio of the cross-sections of the respective HgTe and CdTe ingots is equal to the desired Hg to Cd ratio in the final product.

3. The process of claim 1 wherein the temperature is between about 600° and 700° C.

4. The process of claim 1 wherein x is 0.7, the temperature is 700° C., and the solvent composition is 68 mol% Te, 2 mol% CdTe, and 30 mol% HgTe.

5. The process of claim 1 wherein the solvent is first prepared by: heating the solid constituents of the mixture in a closed enclosure until melted, while under a piston whose density is less than that of the molten solvent mixture, and whose contact face is substantially planar; stopping the heating and permitting the solvent to recrystallize; and removing said piston; so that a substantially homogeneous solvent crystal having a substantially planar upper surface is obtained.

6. The process of claim 5 wherein the melting of the solid constituents of the mixture is in a neutral gas atmosphere.

7. The process of claim 6 wherein the neutral gas atmosphere is argon at a pressure of up to about 2-3 atmospheres.

8. The process of claim 5 wherein said piston is quartz and said mixture constituents are solid pieces in the bottom of said enclosure.

9. The process of claim 5 wherein the ingots of HgTe and CdTe are placed in the enclosure on top of the crystallized solvent and the solvent zone is formed by reheating the crystallized solvent.

* * * * *